United States Patent

Mahant-Shetti et al.

[11] Patent Number: 5,469,079
[45] Date of Patent: Nov. 21, 1995

[54] FLIP-FLOP FOR USE IN LSSD GATE ARRAYS

[75] Inventors: Shivaling S. Mahant-Shetti, Richardson; Robert J. Landers, Plano, both of Tex.

[73] Assignee: Texas Instruments Incorporated, Dallas, Tex.

[21] Appl. No.: 305,238

[22] Filed: Sep. 13, 1994

[51] Int. Cl.[6] ............................................. H03K 19/173
[52] U.S. Cl. ............................. 326/46; 326/16; 327/203
[58] Field of Search ............................. 326/40, 45, 46, 326/16; 327/202, 203

[56] References Cited

U.S. PATENT DOCUMENTS

| | | | |
|---|---|---|---|
| 5,015,875 | 5/1991 | Giles | 327/203 |
| 5,017,809 | 5/1991 | Turner | 326/16 |
| 5,130,568 | 7/1992 | Miller | 327/202 |
| 5,173,626 | 12/1992 | Kudou | 326/16 |
| 5,175,447 | 12/1992 | Kawasaki | 326/16 |
| 5,252,917 | 10/1993 | Kadowaki | 326/16 |
| 5,281,864 | 1/1994 | Hahn | 372/202 |

*Primary Examiner*—Edward P. Westin
*Assistant Examiner*—Andrew Sanders
*Attorney, Agent, or Firm*—John D. Crane; James C. Kesterson; Richard L. Donaldson

[57] ABSTRACT

A flip-flop designed for use in gate arrays following LSSD design rules. The flip-flop has a data input D and a scan data input SD which are gated by control signals fmc, fmc' to the flip-flop input terminal 18. The flip-flop input 18 is gated into a master flip-flop consisting of two inverters 30, 32 coupled back-to-back by a gate signal DMC which is valid when the desired input signal is gated to the flip-flop input 18. The master flip-flop is coupled to a slave flip-flop which is gated by a different control signal. The slave flip-flop consists of two inverters 44, 46 coupled back-to-back. Inverters 48, 50 coupled to the slave flip-flop provide a buffered output therefrom.

8 Claims, 2 Drawing Sheets

FLIP-FLOP FOR USE IN LSSD GATE ARRAYS

FIELD OF THE INVENTION

The present invention relates broadly to devices known as gate arrays and particularly to flip-flops for use in gate arrays which comply with Level Sensitive Scan Design (LSSD) rules.

BACKGROUND OF THE INVENTION

In the field of very large scale integration (VLSI) semiconductor devices, as the number of circuits which can be fabricated on a given chip have increased, the manufacturer has increasingly had difficulty in assuring that the device manufactured actually meets its design specifications. This added difficulty has resulted from the fact that once a device is manufactured, there is no easy way to probe the various circuit points in the device to determine if all the circuits are functioning properly.

In order to overcome this problem, device manufacturers have come up with various test strategies. One approach is to functionally test each device using a known test sequence and to analyze the response of the device under test to the known test sequence. If the response is correct, then the device has passed that particular test and further tests can be conducted.

The functional test approach is reasonably effective for relatively simple devices with relatively few possible responses to a relatively few number of possible inputs. As devices become much more complex, however, functional testing quickly becomes a very lengthy process as the number of possible input stimuli to the device increases. Consequently, functional testing has not proved to be an effective approach for testing VLSI devices.

To overcome this difficulty, various other approaches have been suggested. The level sensitive scan design approach is one which has been utilized by many design teams. In this approach, a scan path is established which allows data to be scanned into internal registers in a device under test. Then, the device is allowed to run for one or more clock cycles. Thereafter, data is scanned out of the device and compared with the data expected as determined by a logic simulator. When the simulator output and the scanned output do not agree, a manufacturing flaw has been detected.

The LSSD design philosophy does have some drawbacks. In the first place, the circuitry required to implement an LSSD design is quite a bit larger in number and size than a comparable design made without compliance with LSSD design rules. In the second place, many circuits, such as flip-flops, are difficult to design and layout in a manner which complies with LSSD design rules. In the third place, circuits which do meet LSSD design rules frequently require a considerably larger number of interconnects which further reduces the actually usable area of a gate array device in which the circuit is included. In the fourth place, typical designs which do comply with LSSD design rules are capacitive thereby slowing the circuit operation.

BRIEF DESCRIPTION

In view of the above mentioned difficulties of designing flip-flops that comply with LSSD design rules, it is a principal advantage of the present invention to provide a flip-flop which does not have design layout problems and has a low input capacitance. In addition, it is another advantage of the invention to provide a flip-flop which does not require a large number of additional circuits to comply with LSSD design rules.

These and other advantages of the present invention are achieved by a circuit which includes selectively actuated switches for either applying data or scan data to the flip-flop input. The circuit input is gated into a master flip-flop which comprises two inverters connected back-to-back. The data thus gated into the master flip-flop is subsequently gated into a slave flip-flop also consisting of two inverters connected together back-to-back. The particular circuit elements utilized to implement this configuration are well suited for producing a small physical layout size, low capacitance circuits, and a configuration with reduced interconnections.

BRIEF DESCRIPTION OF THE DRAWINGS

The circuit for achieving the foregoing and other advantages of the present invention will be described below in connection with the figures which comprise a portion of this disclosure wherein.

DETAILED DESCRIPTION

Figure 1:
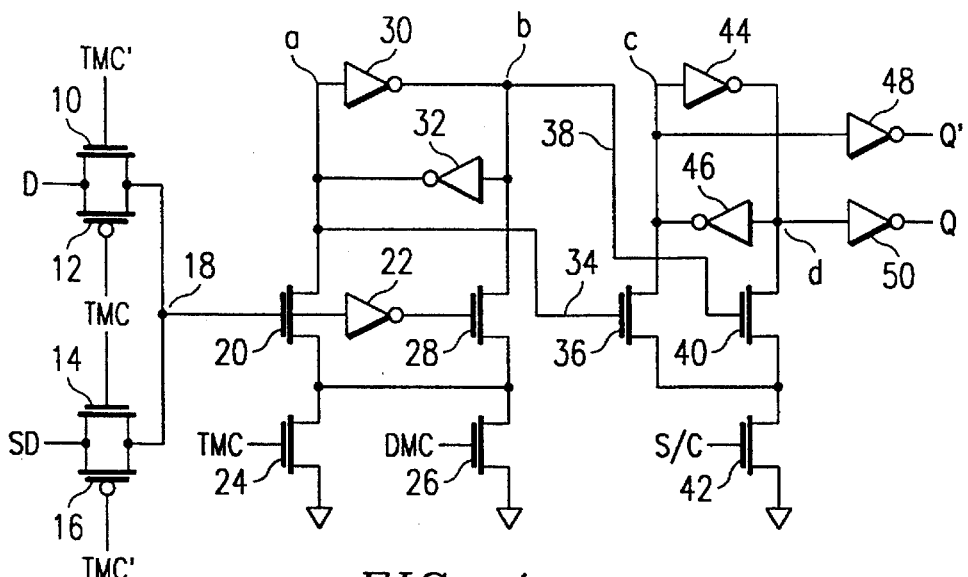
FIG. 1 is a circuit diagram of the preferred embodiment of the resent invention.

Referring first to FIG. 1, the flip-flop of the present invention is illustrated. The circuit includes a data input terminal D and a scan data input terminal SD. The data input terminal D is coupled to a back-to-back coupled N-channel and P-channel transistor 10 and 12 respectively. The scan data input terminal SD is coupled to a back-to-back coupled N-channel and P-channel transistor 14 and 16 respectively. Transistors 10 and 16 are both gated by the selection signal TMC' The transistors 12 and 14 are gated by the selection signal TMC. Thus, when the signal TMC' is high the signal TMC will be low causing the data at the input data terminal D to be coupled to the flip-flop input terminal 18. On the other hand, when TMC is high and TMC' is low, the data at the scan input terminal SD is gated to the flip-flop input terminal 18.

The flip-flop input terminal 18 is coupled to a first N-channel transistor 20 and an inverter 22. When the data at the input terminal 18 is high, the transistor 20 is conductive. On the other hand, when the data at the input terminal 18 is low, transistor 28 is conductive.

Transistor 20 is coupled between terminal a and both N-channel transistor 24 and N-channel transistor 26. Transistors 14 and 24 are gated by the signal TMC which is high whenever the scan data input terminal SD is to be coupled to terminal a. At the same time, signal TMC' is low which also activates P-channel transistor 16. As such, either the high or low level of the scan data input terminal SD is gated to the terminal a whenever the signal TMC is high.

On the other hand, when the signal TMC is low and TMC' is high (i.e., scan data is not desired to be scanned into the flip-flop) and the data active signal dmc is high, the signal at the data input terminal D is coupled to the N-channel transistors 20 and 28. At the same time, N-channel transistor 26 is actuated. This will cause terminal a to go to a virtual ground voltage if the data D is high. If the data D is low, the same status of gating signals on dmc, TMC and TMC' will cause terminal b to go to virtual ground.

If terminal a goes to ground, that voltage is inverted by inverter 30 to cause the voltage at terminal b to go high. When this occurs, the voltage at terminal b is inverted by inverter 32 to cause the voltage at terminal a to go low. Accordingly, this signal pattern is latched into the network between terminal a and terminal b and it will not be affected by later removal of the dmc clock signal.

If terminal b goes to ground as caused by the simultaneous presence of a low signal at D, TMC' being high, TMC being low, and dmc being high, the low at terminal b will be inverted by inverter 32 to produce a high at terminal a. That high at terminal a will be inverted by inverter 30 to keep the voltage at terminal b low even if the dmc clock goes low.

The inverters 30 and 32 comprise the master flip-flop configuration of FIG. 1. They serve to preserve the state of the data input terminal D at the time the clock dmc is high.

Those of skill in the art will readily recognize, however, that if the selectively changeable signals TMC and TMC' changed state from that described above to TMC=high and TMC'=low, the state of the scan data input terminal SD would be latched by the master flip-flop. Thus by selectively controlling the state of TMC and its inverse signal TMC' the master flip-flop will either latch the status of the data input terminal D or the scan data input terminal SD.

Terminal a is coupled by a wire 34 to the gate of an N-channel transistor 36 and terminal b is coupled by a wire 38 to the gate of an N-channel transistor 40. The transistors 36 and 40 are coupled to yet another N-channel transistor 42. The gate of transistor 42 is gated by the slave clock slc. The transistors 36 and 40 are also coupled to the slave flip-flop consisting of back-to-back coupled inverters 44 and 46.

The slave flip-flop operates in the following manner. When the slave clock slc is high, either transistor 36 or 40 will conduct depending on which one has a high level signal at its gate. Assuming that the gate of transistor 36 is high, transistor 36 will be conductive when transistor 42 is conductive while the slave clock slc is present. This will cause the voltage at terminal c to go low. The signal at terminal c being low will cause the voltage at terminal d to go high due to the inversion produced by inverter 44. That signal will thereafter be latched by the action of inverter 46 which inverts the signal at terminal d and places low on terminal c. The levels at terminals c and d will be reversed if a high voltage is applied to the gate of transistor 40.

In order to provide buffering of the data in the slave flip-flop, inverters 48 and 50 are respectively coupled to terminals c and d. These inverters will respectively provide output signals at terminals Q' and Q. Once both the master and slave flip-flops have been set, the output at Q will be high if the signal applied to flip-flop input terminal 18 is high. However, if the signal applied to the flip-flop input terminal 18 is low, the output at Q will be low. The output at output terminal Q' will be the opposite of the signal at output terminal Q.

Figure 2:
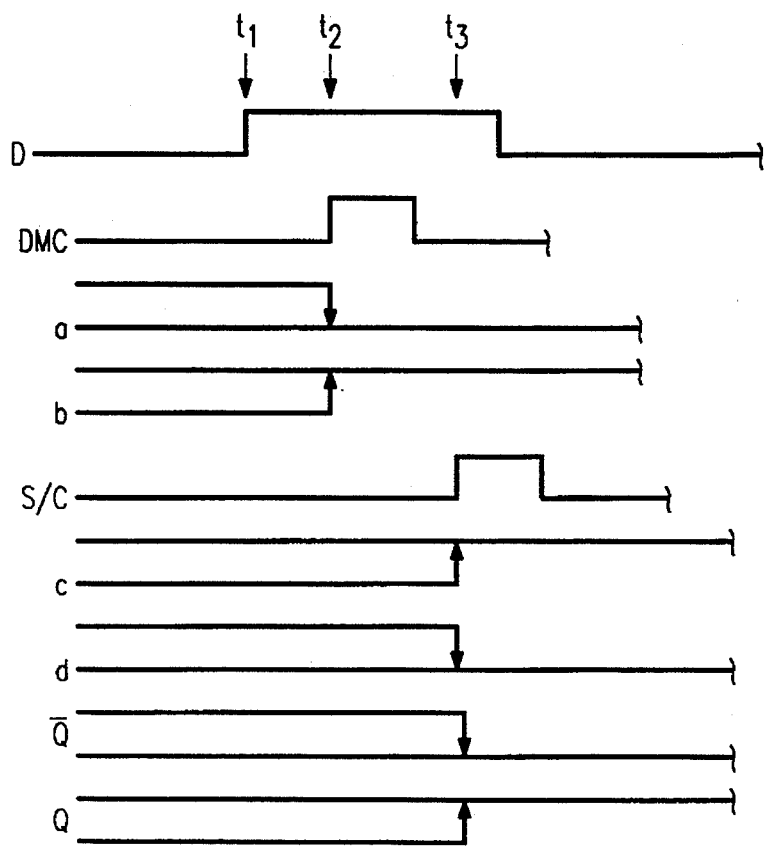
FIG. 2 is a timing diagram illustrating the operation of the circuit in FIG. 1.

While the operation of the circuit of FIG. 1 has already been described above, reference should now be made to FIG. 2. FIG. 2 illustrates the timing of signals at various points in the circuit of FIG. 1 at different times. It will be noted that at some times prior the occurrence of the DMC gate signal and the slc gate signal, the state of some of the circuit points is not known and, hence, can take on either a high or low value. Once the gate signal DMC and slc have appeared, however, the level of all the points in the circuit of FIG. 1 become determined as illustrated in FIG. 2 and are a function of the level of the input data signal on line D at the time of the DMC gate signal.

Figure 3:
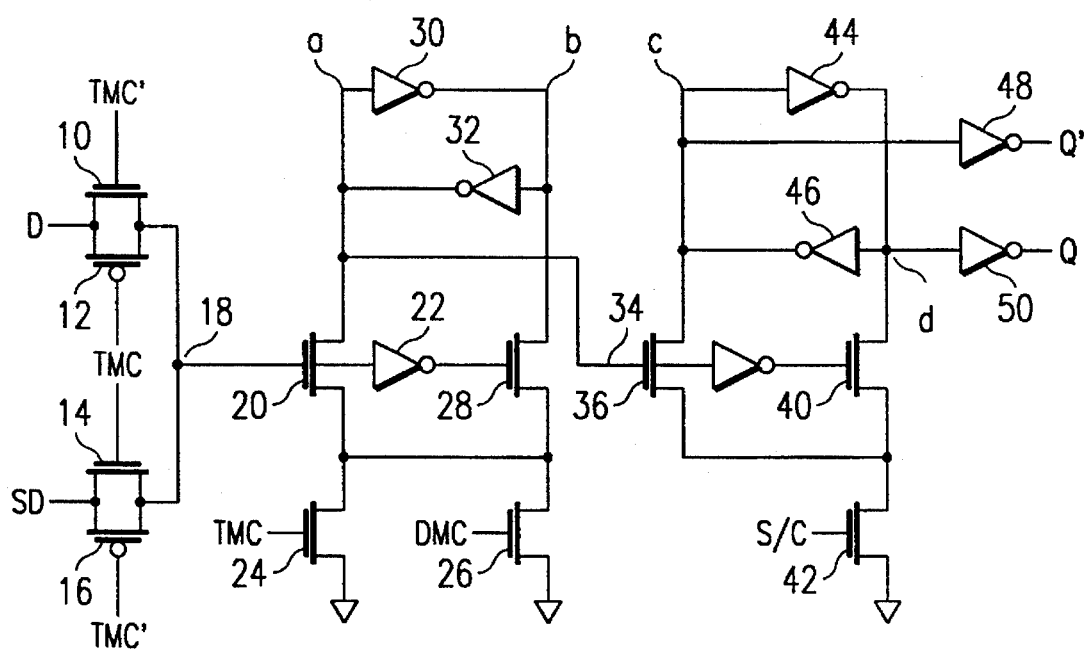
FIG. 3 is a somewhat modified version of the circuit of FIG. 1.

FIG. 3 illustrates a somewhat modified version of the circuit of FIG. 1. The principal difference between FIG. 1 and FIG. 3 is that the gating of the slave flip-flop is different although the two circuits will function in the same manner. FIG. 3, however, may function somewhat slower than does FIG. 1 due to the inverters located between the master flip-flop and the slave flip-flop.

While the foregoing description has been made with particular emphasis on the operation of the preferred embodiment of the invention, those of skill in the art will readily recognize that various modifications may be made to the circuit of FIG. 1 with departing from the spirit and scope of the present invention as defined by the following claims.

What is claimed is:

1. A flip-flop for use in gate arrays designed in compliance with LSSD design rules comprising, in combination:

a flip-flop input terminal;

a data input terminal;.

a scan data input terminal:

a selectively actuated switch to couple either said data input terminal or said scan data input terminal to said flip-flop input terminal;

a master flip-flop comprising two inverters coupled back-to-back;

a first switch coupled between said master flip-flop and said flip-flop input terminal to set said master flip-flop at a first time to a state indicative of the state of the signal at said flip-flop input terminal;

a slave flip-flop comprising two inverters coupled back-to-back;

a second switch coupled between said master flip-flop and said slave flip-flop to set said slave flip-flop at a second time after said first time to a state indicative of the state of the state of said master flip-flop;

said first switch includes a first N-channel transistor coupled between said flip-flop input terminal and said master flip flop; and said first switch additionally includes a second N-channel transistor coupled to said master flip-flop and an inverter coupled between said second N-channel transistor and said flip-flop input terminal.

2. A flip-flop for use in gate arrays designed in compliance with LSSD design rules comprising, in combination:

a flip-flop input terminal;

a data input terminal;

a scan data input terminal;

a selectively actuated switch to couple either said data input terminal or said scan data input terminal to said flip-flop input terminal;

a master flip-flop comprising two inverters coupled back-to-back;

a first switch coupled between said master flip-flop and said flip-flop input terminal to set said master flip-flop at a first time to a state indicative of the state of the signal at said flip-flop input terminal;

a slave flip-flop comprising two inverters coupled back-to-back;

a second switch coupled between said master flip-flop and said slave flip-flop to set said slave flip-flop at a second time after said first time to a state indicative of the state of the state of said master flip-flop; and said second switch includes a pair of N-channel transistors, one said N-channel transistor being actuated by a first state being stored in said master flip-flop and the other said N-channel transistor being actuated by a second state being stored in said master flip-flop.

3. A flip-flop for use in gate arrays designed in compliance with LSSD design rules comprising, in combination:

a data input terminal;

a scan data input terminal;

a flip-flop input terminal;

a selectively actuated switch for coupling either said data input terminal or said scan data input terminal to said flip-flop input terminal;

a master flip-flop consisting of a pair of inverters coupled back-to-back and having two flip-flop output terminals;

a first N-channel transistor coupled to one said flip-flop output terminal and actuated by said flip-flop input terminal having a first level signal thereat;

a second N-channel transistor coupled to the other one said flip-flop output terminal and actuated by said flip-flop input terminal having a second level signal thereat;

a slave flip-flop consisting of a pair of inverters coupled back-to-back and having two flip-flop output terminals;

a pair of N-channel transistors coupled between said slave flip-flop and said master flip-flop;

a third N-channel transistor coupled to said pair of N-channel transistors for actuating said pair of N-channel transistors at a time following data being gated into said master flip-flop.

4. The flip-flop of claim 3 additionally including an additional N-channel transistor series connected with said first and second N-channel transistor and actuated at a first time to gate the state of the signal at said flip-flop input terminal into said master flip-flop.

5. The flip-flop of claim 3 wherein said selectively actuated switch includes a first N-channel transistor and a first P-channel transistor coupled back-to-back and coupled between one said data input terminal and said flip-flop input terminal, said transistors being actuated by complementary gate signals so that in one state of said gate signals, said transistors are conductive and in the other state of said gate signals, said transistors are non-conductive.

6. The flip-flop of claim 3 wherein said selectively actuated switch includes a first N-channel transistor and a first P-channel transistor coupled back-to-back and coupled between said data input terminal and said flip-flop input terminal and a second N-channel transistor and a second P-channel transistor coupled back-to-back and coupled between said scan data input terminal and said flip-flop input terminal, said transistors being actuated by complementary gate signals so that only one of said data input terminal or said scan data input terminal is coupled to said flip-flop input terminal.

7. The flip-flop of claim 3 additionally including at least one additional inverter coupled to said slave flip-flop so as to produce at the output of said additional inverter a signal indicative of the state of said slave flip-flop.

8. The flip-flop of claim 3 additionally including a pair of additional inverters coupled to said slave flip-flop so as to produce a pair of complementary output signals at the output of said additional inverters.

* * * * *